US007714652B2

(12) United States Patent
Mangudi et al.

(10) Patent No.: US 7,714,652 B2

(45) Date of Patent: May 11, 2010

(54) METHOD FOR ADJUSTING THRESHOLD VOLTAGE AND CIRCUIT THEREFOR

(75) Inventors: Aravind Mangudi, Gilbert, AZ (US); Eric David Joseph, Chandler, AZ (US); Mahbub Hasan, Laveen, AZ (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 22 days.

(21) Appl. No.: 12/098,847

(22) Filed: Apr. 7, 2008

(65) Prior Publication Data

US 2009/0251213 A1 Oct. 8, 2009

(51) Int. Cl.
*H03F 3/45* (2006.01)

(52) U.S. Cl. ....................................... 330/253; 327/534

(58) Field of Classification Search ......... 330/252–261; 327/534, 537

See application file for complete search history.

(56) References Cited

U.S. PATENT DOCUMENTS 5,726,597 A * 3/1998 Petty et al. .................. 327/307
6,509,795 B1 * 1/2003 Ivanov ....................... 330/253
6,870,422 B2 3/2005 Stockstad
7,064,609 B1 6/2006 Beck et al.
7,088,178 B1 8/2006 Rosenfeld et al.

OTHER PUBLICATIONS

Lehmann, T. and Cassia, M., "1-V Power Supply CMOS Cascode Ampoifier," IEEE Journal of Solid-State Circuits, vol. 36, No. 7, pp. 1082-1086 Jul. 2001.

Schlogl F. and Zimmerman H., "Low-voltae operational amplifer in 0.12 um digital CMOS technology," IEEE proc.-Circuits Devices Syste., Vo. 151, No. 5, pp. 395-398, Oct. 2004.

* cited by examiner

*Primary Examiner*—Robert Pascal
*Assistant Examiner*—Hieu P Nguyen
(74) *Attorney, Agent, or Firm*—Rennie W. Dover

(57) ABSTRACT

A method and circuit for changing a threshold voltage of a transistor. The circuit includes a sense circuit coupled to a switching transistor, a circuit transistor and to one terminal of a resistor. The other terminal of the resistor is connected to a body contact. The switching transistor directs current along one of two different paths in response to an input voltage sensed by the sense circuit. When the switching transistor directs a first current along one path, the first current is steered towards the resistor and flows through the resistor in one direction and when the switching transistor directs a second current along the other path, the second current is directed towards the resistor and flows through the resistor in the opposite direction from the first current. Steering the currents varies the potential of a body with respect to the potential at the source of the circuit transistor.

12 Claims, 5 Drawing Sheets

200

METHOD FOR ADJUSTING THRESHOLD VOLTAGE AND CIRCUIT THEREFOR

TECHNICAL FIELD

The present invention relates, in general, to integrated circuits and, more particularly, to the threshold voltage of transistors in an integrated circuit.

BACKGROUND

Complementary Metal Oxide Semiconductor (CMOS) low voltage amplifiers are used in a variety of circuit applications including consumer electronics, telecommunications, automotive, aviation, etc. Typically these amplifiers are connected in a feedback configuration to linearly amplify a voltage difference that appears at their inputs. Like other integrated circuits, CMOS low voltage amplifiers are described in terms of various performance parameters, e.g., common mode input voltage, common mode rejection ratio, gain, slew rate, full-power bandwidth, input resistance, and output resistance, among others. Common mode input voltage range is an important performance parameter that indicates the range of input voltages over which a differential amplifier behaves in a linear fashion, i.e., the range of input voltages over which the amplifier can operate without any of the circuits of the individual gain stages within the amplifier entering a saturation operating mode. Common mode rejection ratio (CMRR) is a related performance parameter that is defined as the ratio of the open loop gain of the CMOS low voltage amplifier to its common mode gain. This performance parameter is a measure of the operational amplifier's ability to reject input signals that are common to both of the operational amplifier's differential inputs.

For CMOS low voltage operational amplifiers, it is desirable to maintain a high common mode rejection ratio over a wide range of common mode input voltages. This is a challenging goal because the processes for manufacturing CMOS low voltage amplifiers are typically suited for building field effect transistors having high threshold voltages. FIG. 1 illustrates a prior art CMOS low voltage operational amplifier 10 manufactured using a 5 volt CMOS process for which the nominal threshold voltages of field effect transistors 20, 22, 30, 32, 34, and 36 are about 0.8 volts. CMOS low voltage operational amplifier 10 comprises a differential pair 12 of transistors coupled to a differential pair load 14 and to a current source 16. Differential pair 12 comprises P-channel metal oxide semiconductor field effect transistors (MOSFETS) 20 and 22, wherein the sources of P-channel MOSFETS 20 and 22 are commonly connected together and the gates are coupled for receiving input signals $V_{IN+}$ and $V_{IN-}$, respectively. In addition to input signals $V_{IN+}$ and $V_{IN-}$, the gates of P-channel MOSFETS 20 and 22 each receive a common mode input signal $V_{CM}$. The sources of P-channel MOSFETS 20 and 22 are also electrically coupled to the body or bulk terminal 26 of the semiconductor material from which the operational amplifier is manufactured. The drains of P-channel MOSFETS 20 and 22 are coupled to differential pair load 14 which is coupled for receiving a source of operating potential $V_{EE}$. By way of example, load 14 is a current mirror.

Current source 16 comprises P-channel MOSFETS 30, 32, 34, and 36 coupled in a cascode configuration, wherein the drain of P-channel MOSFET 32 is coupled to source of operating potential $V_{EE}$ through a current setting resistor 38, and the drain of P-channel MOSFET 36 is connected to the sources of P-channel MOSFETS 20 and 22. The sources of P-channel MOSFETS 30 and 34 are commonly coupled for receiving a source of operating potential $V_{CC}$. The gates of P-channel MOSFETS 30 and 34 are connected together and to the drain of P-channel MOSFET 32. The gates of P-channel MOSFETS 32 and 36 are connected together and for receiving a bias voltage $V_{BIAS}$. In operation, the maximum common mode input voltage $V_{CM,MAX}$ that can be applied to differential pair 12 is given by equation 1 (EQT. 1):

$$V_{CM,MAX}=V_{CC}-(|V_{tho}|+2*V_{dsat}) \quad \text{EQT. 1}$$

where:

$V_{CC}$ is the upper supply or upper supply rail of the amplifier (volts);

$V_{tho}$ is the threshold voltage with zero potential across the body and source terminals (volts); and $V_{dsat}$ is the saturation voltage for the P-channel MOSFET (volts).

For a 5 volt CMOS process in which the upper supply rail is 1.8 volts and the saturation voltage for the P-channel MOSFETS is about 100 millivolts, the maximum common mode input voltage, $V_{CM,MAX}$, is about 0.8 volts.

The minimum common mode input voltage $V_{CM,MIN}$ that can be applied to differential pair 12 is given by equation 2 (EQT. 2):

$$V_{CM,MIN}=V_{EE}+V_{DIFFLD}-|V_{tho}| \quad \text{EQT. 2}$$

where:

$V_{EE}$ is the lower supply or lower supply rail of the amplifier (volts);

$V_{DIFFLD}$ is the voltage drop across differential pair load 14 (volts); and $V_{tho}$ is the threshold voltage with zero potential across the body and source terminals (volts).

For the 5 volt CMOS process in which the lower supply rail is 0 volts and the voltage drop across differential pair load 14 is about 100 millivolts, the minimum common mode input voltage, $V_{CM,MIN}$, is about −0.5 volts. Thus, the common mode input voltage range is about 1.3 volts.

A drawback with this circuit is that techniques for increasing the maximum common mode input voltage $V_{CM,MAX}$ have also increased the minimum common mode input voltage $V_{CM,MIN}$. Because both the maximum and minimum common mode input voltages are increased, the common mode input voltage range is not increased.

Another parameter that limits the common mode range of a circuit such as, for example, an operational amplifier, is the threshold voltages of the transistors making up the circuit. When the threshold voltages of these circuits are large, parameters such as common mode range are degraded. This limitation also applies to other analog and digital circuits.

Accordingly, it would be advantageous to have a circuit and a method for increasing the common mode input voltage range. In addition, it would be advantageous for the circuit and method to adjust the threshold voltages of the transistors in the circuit. It would be of further advantage for the circuit and method to be time and cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

Figure 1:
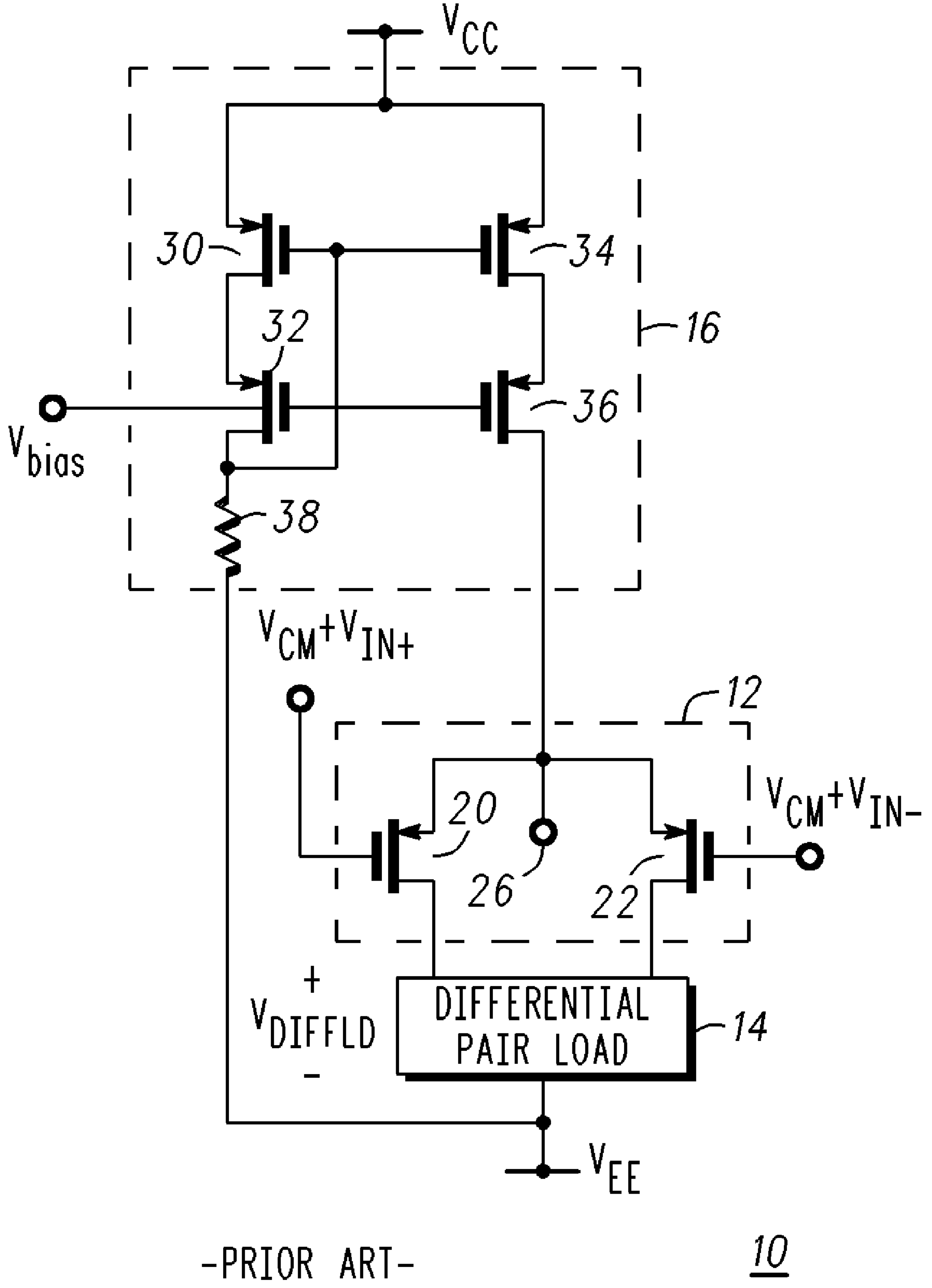
FIG. 1 is a circuit schematic of a prior art CMOS operational amplifier.

Generally, the present invention provides a method and a structure for adjusting the threshold voltages of transistors and increasing the common mode input voltage range of circuits such as, for example, operational amplifiers, comparators, microprocessors, controllers, sensors, drivers, or the like. It should be noted that the threshold voltages may be adjusted upward, i.e., increased, or downward, i.e., decreased. In accordance with an embodiment, the present invention comprises a method for changing a threshold voltage of a transistor by steering current through a resistance in response to an input signal, wherein the current varies a potential of a body region of a semiconductor material. It should be noted that the body region refers to the bulk of the semiconductor material in which a gate, source, and drain of a transistor are formed. For example, the body region of a P-channel device may be an N-well, i.e., a doped region of N-type conductivity in a semiconductor material, wherein the source and drains are formed in the N-well and the gate controls the formation of a channel between the source and drain regions that are formed in the N-well. The body region of an N-channel device may be a P-well, i.e., a doped region of P-type conductivity in a semiconductor material, wherein the source and drains are formed in the P-well and the gate controls the formation of a channel between the source and drain regions that are formed in the P-well. Alternatively, the body region may be a body of semiconductor material from which the source and drains of a transistor are formed wherein the gate controls the formation of a channel between the source and drain regions. The body of semiconductor material may be an epitaxial layer or a semiconductor substrate material.

In accordance with another embodiment of the present invention, a first current that flows along a first path in response to a common mode input voltage being greater than a reference signal is provided. The first current flows along a second path in response to the common mode input voltage range being less than the reference signal. When the first current flows along the second path, second and third currents are generated by taking the product of separate area multipliers and the first current. A fourth current is generated by amplifying or multiplying the second current with another area multiplier. A fifth current is provided that is used to make a first voltage greater than a voltage of a body or body region of a semiconductor material when the first current flows along the first path. The third, fourth, and fifth currents are used to make the first voltage less than the voltage of the body of the semiconductor material when the first current flows along the second path.

In accordance with another embodiment of the present invention, a circuit comprises a differential pair of transistors having commonly coupled sources. First and second current sources are coupled to first and second switches, respectively, through the commonly coupled sources, and third and fourth current sources are coupled to a bulk or body terminal of the operational amplifier through third and fourth switches, respectively. A common mode sense circuit is coupled to the commonly coupled sources and a bias resistor is coupled between the body terminal and the commonly coupled sources.

In accordance with another embodiment of the present invention, an operational amplifier comprises a differential pair of transistors having current carrying electrodes commonly connected together. A common mode sense circuit is connected to the commonly connected current carrying electrodes. A switching transistor is connected to the common mode sense circuit and the common mode sense circuit and the switching transistor are coupled to a current source. A bias resistor is coupled between the commonly connected current carrying electrodes and a body terminal.

It should be further noted that the gate of a transistor is also referred to as a gate electrode or a control electrode and the drain and source of a transistor are also referred to as the drain electrode and the source electrode or as current carrying electrodes.

Figure 2:
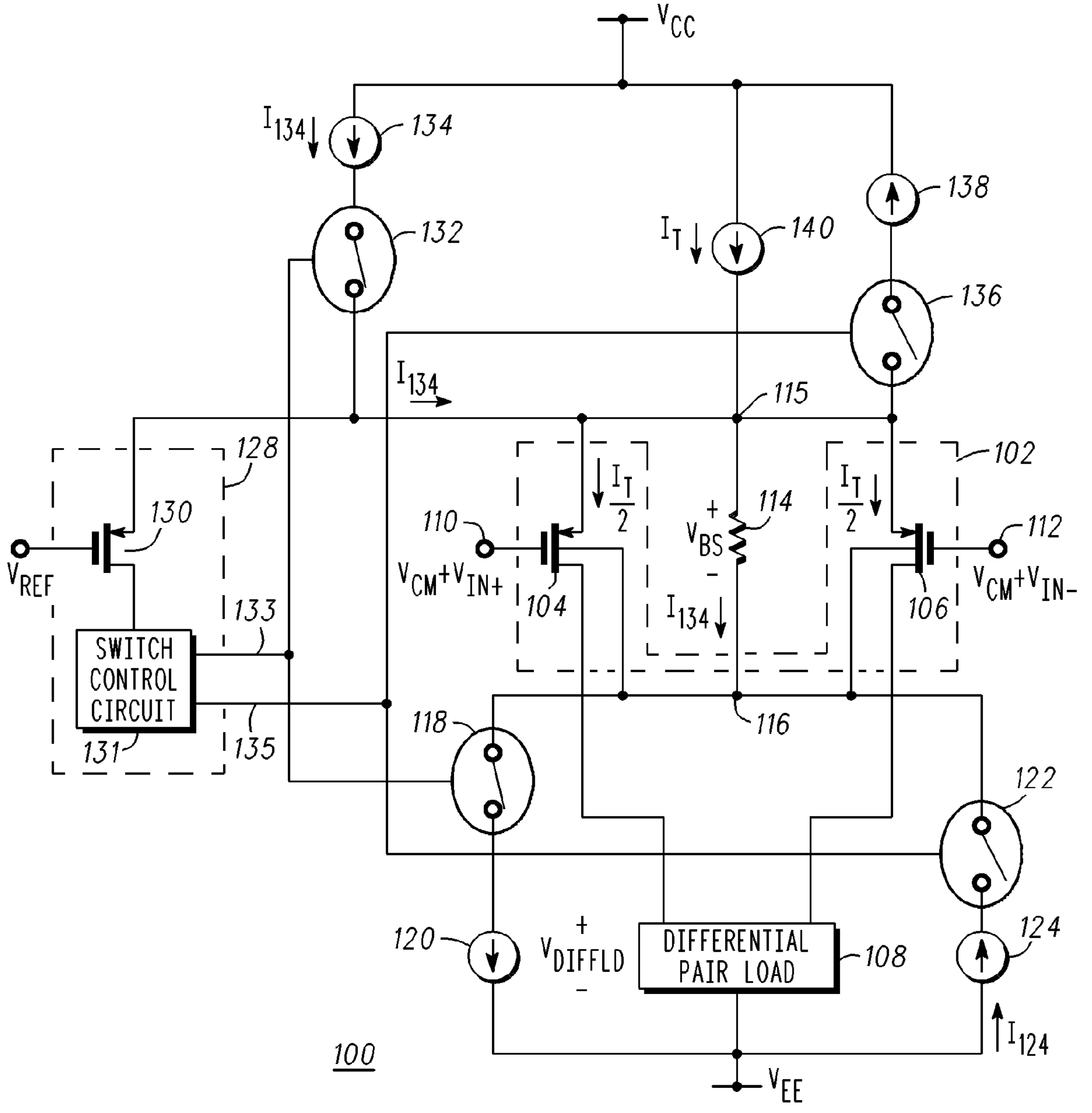
FIG. 2 is a circuit schematic of a CMOS operational amplifier in a first switching configuration in accordance with an embodiment of the present invention.

FIG. 2 is a circuit schematic of a CMOS low voltage operational amplifier 100 in a first switching configuration in accordance with an embodiment of the present invention. What is shown in FIG. 2 is a differential pair 102 comprising P-channel MOSFETS 104 and 106 having sources coupled together, drains coupled to a differential pair load 108, body or body regions coupled to a body or bulk terminal 116, and gates that serve as inputs 110 and 112 of CMOS low voltage operational amplifier 100 and that are coupled for receiving input common mode signal $V_{CM}$. Typically, the gates of P-channel MOSFETS 104 and 106 are also coupled for receiving input signals $V_{IN+}$ and $V_{IN-}$, respectively. Differential pair load 108 may be comprised of an active load or a passive load. The types of loads for a differential pair are known to those skilled in the art. For example, differential pair load 108 may be a current mirror. One terminal of a bias resistor 114 is connected to the sources of P-channel MOSFETS 104 and 106 at a node 115 and the other terminal of bias resistor 114 is connected to body or bulk terminal 116. A switch 118 is coupled between body terminal 116 and a terminal of a current source 120. The other terminal of current source 120 is coupled for receiving a source of operating potential such as, for example, a potential $V_{EE}$. A switch 122 is coupled between body terminal 116 and a terminal of a current source 124. The other terminal of current source 124 is coupled for receiving, for example, source of operating potential $V_{EE}$.

As those skilled in the art are aware, in a standard CMOS process, each P-channel MOSFET has a gate, a source, a drain, and a bulk or body. A contact is made to the gate through a gate electrode or terminal, a contact is made to the source through a source electrode or terminal, a contact is made to the drain through a drain electrode or terminal, and a contact is made to the bulk or body through a body electrode or terminal. Typically, for every P-channel MOSFET that has a source, there will be a body connection.

A common mode sense circuit 128 is coupled to node 115. Common mode sense circuit 128 has a reference terminal coupled for receiving reference voltage $V_{REF}$ and a current sensing terminal connected to the sources of P-channel MOSFETS 104 and 106 and to one terminal of bias resistor 114 at node 115. In accordance with an embodiment of the present invention, common mode sense circuit 128 comprises a P-channel current sensing MOSFET 130 connected to a switch control circuit 131. P-channel sensing MOSFET 130 has a gate that serves as the reference terminal of common mode sense circuit 128, a drain that is coupled to a current sensing input of switch control circuit 131, and a source that is coupled to the sources of P-channel MOSFETS 104 and 106, and to one terminal of bias resistor 114 at node 115. Switch control circuit 131 has an output 133 coupled to switches 132 and 118 and an output 135 coupled to switches 136 and 122.

The source of P-channel MOSFET 130 is also coupled to one terminal of a current source 134 through a switch 132. The other terminal of current source 134 is coupled for receiving a source of operating potential $V_{CC}$. Thus, the sources of P-channel MOSFETS 104 and 106 and one terminal of bias resistor 114 are coupled to current source 134 through switch 132. The sources of P-channel transistors 104, 106, and 130 and one terminal of bias resistor 114 are also connected to a terminal of a current source 138 through a switch 136 and the other terminal of current source 138 is coupled for receiving source of operating potential $V_{CC}$. In addition, the sources of P-channel transistors 104, 106, and 130 and one terminal of bias resistor 114 are coupled for receiving source of operating potential $V_{CC}$ through a current source 140.

Figure 3:
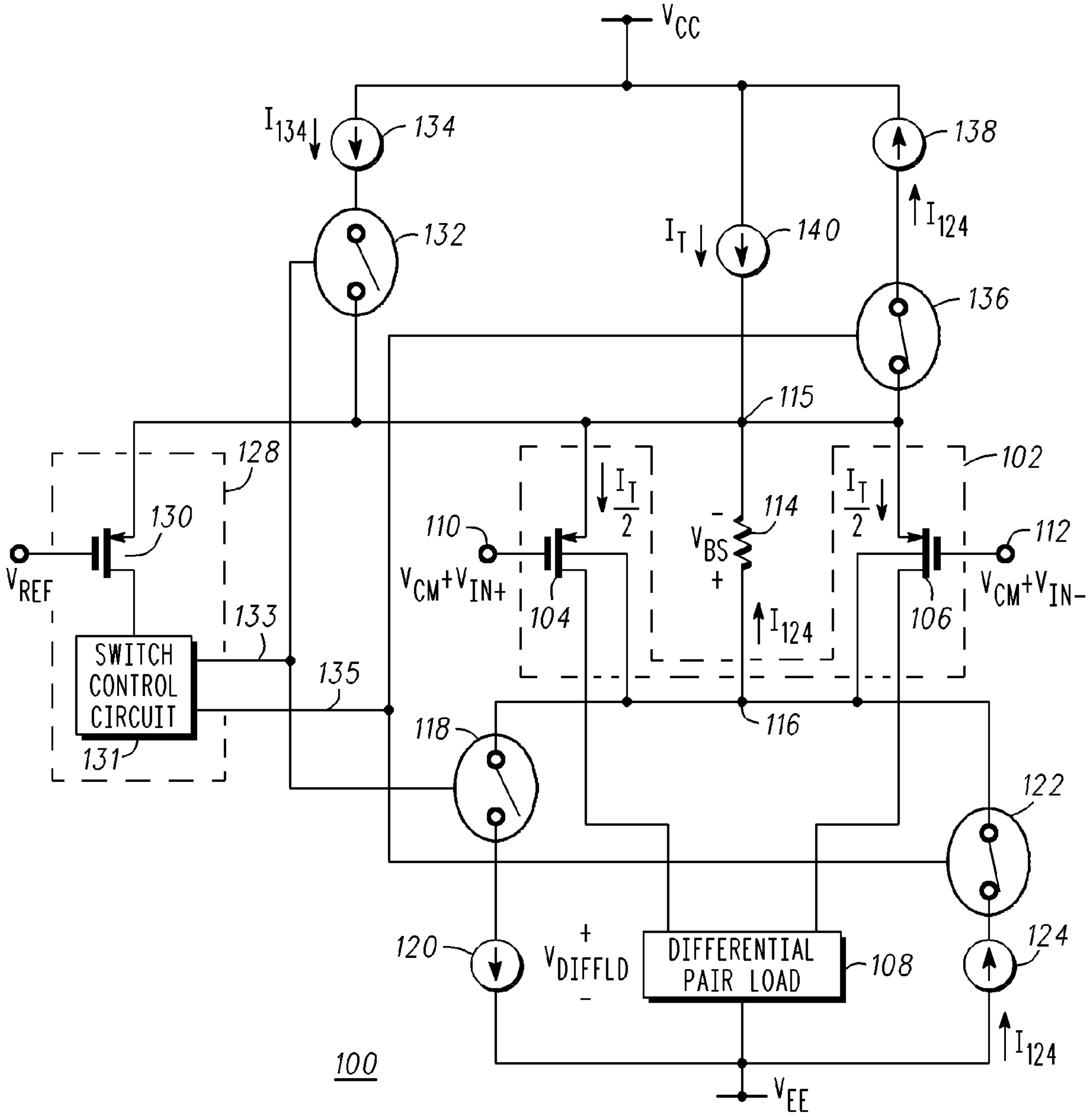
FIG. 3 is a circuit schematic of the CMOS operational amplifier of FIG. 2 in a second switching configuration in accordance with an embodiment of the present invention.

It should be noted that FIG. 2 illustrates CMOS low voltage operational amplifier 100 having switches 118 and 132 in closed positions and switches 122 and 136 in open positions. FIG. 3, on the other hand, illustrates CMOS low voltage operational amplifier 100 having switches 118 and 132 in open positions and switches 122 and 136 in closed positions. For the sake of clarity, the operation for the configuration of CMOS low voltage operational amplifier 100 shown in FIG. 2 is described (i.e., when switches 118 and 132 are closed and switches 122 and 136 are open) followed by the description of CMOS low voltage operational amplifier 100 having the configuration shown in FIG. 3 (i.e., when switches 118 and 132 are open and switches 122 and 136 are closed).

Referring again to FIG. 2, when common mode input voltage $V_{CM}$ is greater than reference voltage $V_{REF}$, P-channel sensing MOSFET 130 of common mode sense circuit 128 conducts a drain current that flows to the current sensing input of switch control circuit 131. In response to the drain current, switch control circuit 131 generates a control signal that is transmitted to switches 132 and 118 via output 133. In addition, switch control circuit 131 generates a control signal that is transmitted to switches 136 and 122. The control signal transmitted via output 133 closes switches 132 and 118 and the control signal transmitted via output 135 opens switches 136 and 122. With switches 132 and 118 closed, switches 136 and 122 open, and common mode input voltage $V_{CM}$ greater than reference voltage $V_{REF}$, the voltage at the sources of each P-channel MOSFET 104 and 106 is greater than the body voltage ($V_{BODY}$) of the semiconductor material from which CMOS low voltage operational amplifier 100 is fabricated. A current $I_{134}$ from current source 134 flows towards node 115. In addition, a bias current $I_T$ flows from current source 140 towards node 115. Bias current $I_T$ is divided between P-channel MOSFETS 104 and 106 so that a current $I_T/2$ flows from the sources to the drains of each P-channel MOSFET 104 and 106. Thus, current $I_{134}$ is steered towards node 115 then flows through node 115 through bias resistor 114, body contact 116, and current source 120 to source of operating potential $V_{EE}$. The potential developed across bias resistor 114 by current $I_{134}$ generates an input pair body-to-source potential ($V_{BS}$) that is less than zero, i.e., the body-to-source potential, $V_{BS}$, for transistors 104 and 106 is less than zero. Thus, steering current $I_{134}$ through bias resistor 114 by closing switches 118 and 132 and opening switches 122 and 136 decreases the body potential to be less than the potential at the sources of transistors 104 and 106. This causes the effective threshold voltage ($V_{th}$) of input transistors 104 and 106 to be lower than their nominal value of $V_{tho}$, which increases the maximum common mode input voltage that can be achieved by CMOS low voltage operational amplifier 100.

Referring now to FIG. 3, in response to common mode sense circuit 128 sensing the common mode input voltage $V_{CM}$ being less than voltage $V_{REF}$, P-channel sensing MOSFET 130 of common mode sense circuit 128 is substantially non-conductive, i.e., there is substantially zero drain current flowing to the current sensing input of switch control circuit 131. In response to the substantially zero drain current, switch control circuit 131 generates a disable control signal that is transmitted to switches 118 and 132 via output 133 and an enable control signal that is transmitted to switches 122 and 136 via output 135. The disable control signal transmitted via output 133 opens switches 118 and 132 and the enable control signal transmitted via output 135 closes switches 122 and 136. With common mode input voltage $V_{CM}$ less than reference voltage $V_{REF}$, switches 118 and 132 are opened and switches 122 and 136 are closed. Under this condition, the voltages at the sources of P-channel MOSFETS 104 and 106 are less than the body voltage ($V_{BODY}$) of the semiconductor material from which CMOS low voltage operational amplifier 100 is fabricated. A current $I_{124}$ from current source 124 flows towards body contact 116 to vary the potential of the semiconductor material or substrate. Like the configuration shown in FIG. 2, bias current $I_T$ flows from current source 140 towards node 115 and is divided between P-channel MOSFETS 104 and 106 so that a current $I_T/2$ flows from the sources to the drains of each P-channel MOSFET 104 and 106. Current $I_{124}$ is steered towards body contact 116 and flows from body contact 116 through bias resistor 114, node 115, and current source 138 to source of operating potential $V_{CC}$. The potential developed across bias resistor 114 by current $I_{124}$ generates an input pair body-to-source potential ($V_{BS}$) that is greater than zero, i.e., the body-to-source potential, $V_{BS}$, for transistors 104 and 106 is greater than zero. Thus steering current $I_{124}$ through bias resistor 114 by opening switches 118 and 132 and closing switches 122 and 136 increases the body potential so that it is greater than the potential at the sources of transistors 104 and 106. This causes the effective threshold voltage ($V_{th}$) of input transistors 104 and 106 to be greater than their nominal value of $V_{tho}$, which decreases the minimum common mode input voltage that can be achieved by CMOS low voltage operational amplifier 100. Thus, CMOS low voltage operational amplifier 100 in accordance with embodiments of the present invention has controlled bi-directional body biasing that causes the effective threshold voltage of P-channel MOSFET transistors 104 and 106 to change in such a manner so as to give amplifier 100 the widest common mode input voltage range while maintaining a good common mode rejection ratio.

Figure 4:
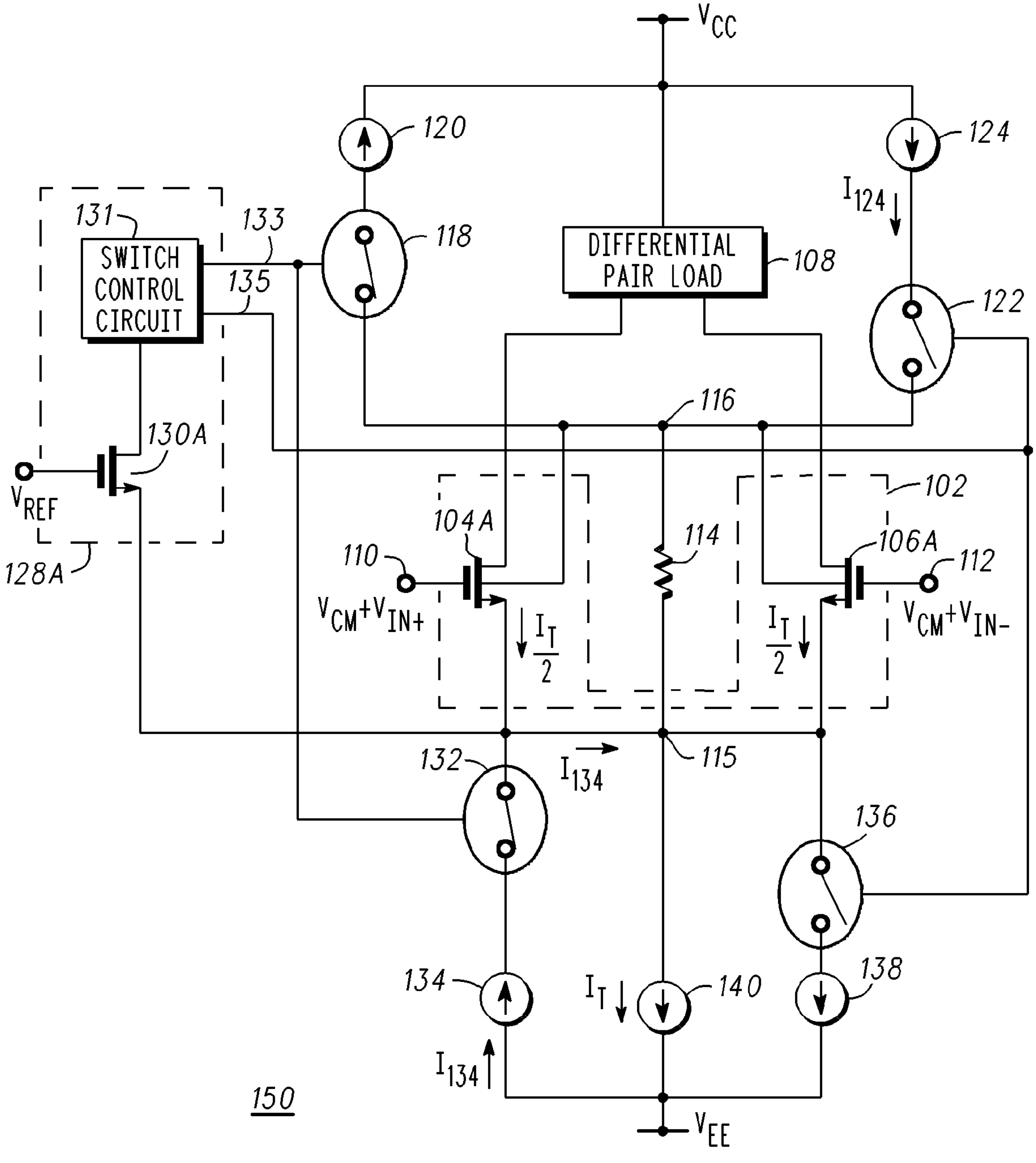
FIG. 4 is a circuit schematic of a CMOS operational amplifier in accordance with another embodiment of the present invention.

Although CMOS low voltage operational amplifier 100 has been described using P-channel MOSFETS, this is not a limitation of the present invention. FIG. 4 is a circuit schematic of a CMOS low voltage operational amplifier 150 in which P-channel MOSFETS 104, 106, and 130 have been replaced with N-channel MOSFETS 104A, 106A, and 130A. The operation of CMOS low voltage operational amplifier 150 is similar to that of CMOS low voltage operational amplifier 100.

Figure 5:
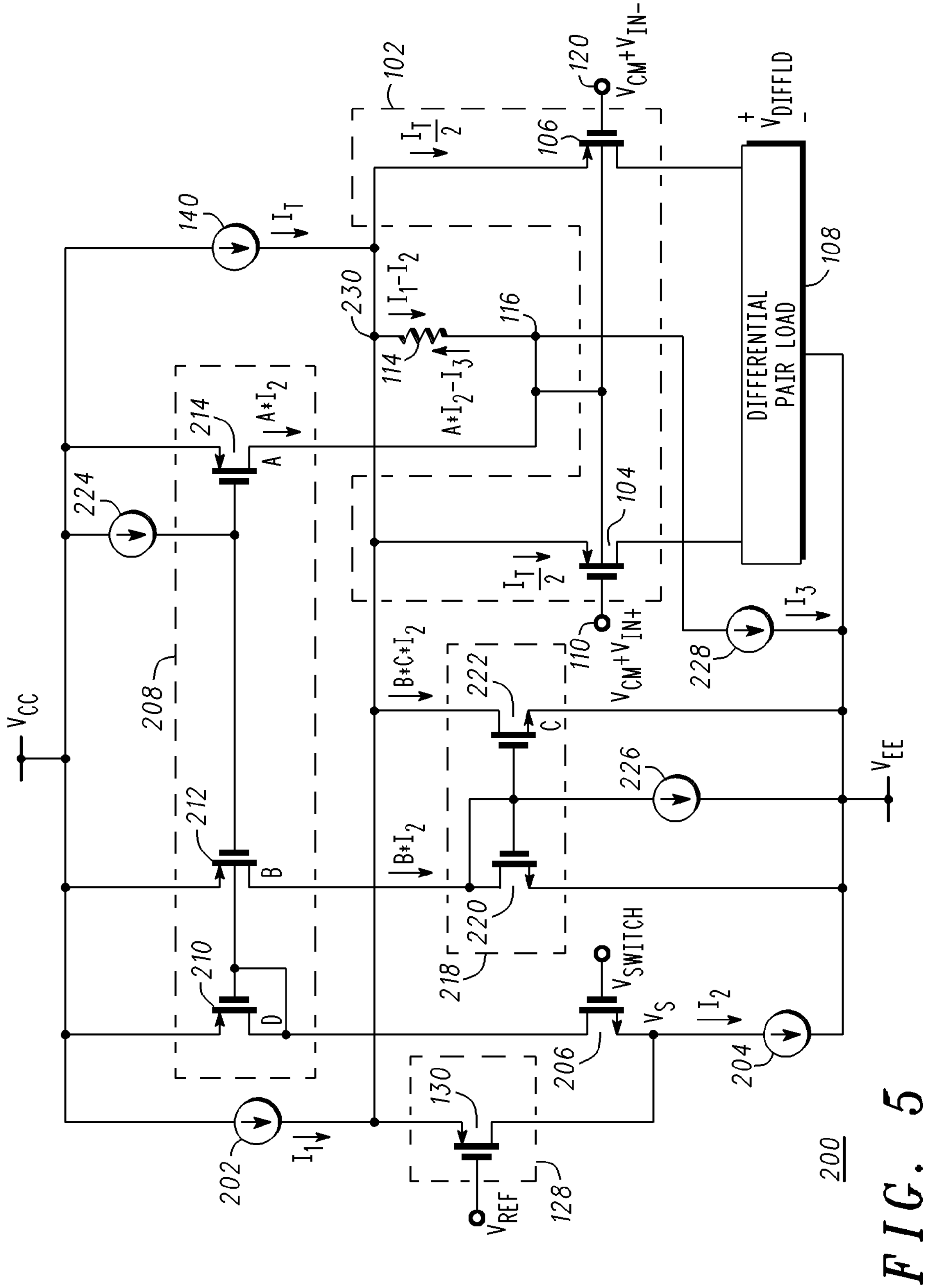
FIG. 5 is a circuit schematic of a CMOS operational amplifier in accordance with another embodiment of the present invention.

FIG. 5 is a circuit schematic of a CMOS low voltage operational amplifier 200 in accordance with another embodiment of the present invention. CMOS low voltage operational amplifier 200 comprises differential pair 102 having P-channel MOSFETS 104 and 106, bias resistor 114 coupled between body terminal 116 and the sources of P-channel MOSFETS 104 and 106, a current source 140, a differential pair load 108, and common mode sense circuit 128. By way of example, common mode sense circuit 128 is a P-channel MOSFET 130. A current source 202 has one terminal connected to the source of P-channel MOSFET 130 and the other terminal coupled for receiving source of operating potential $V_{CC}$ and a current source 204 has one terminal connected to the drain of P-channel MOSFET 130 and the other terminal coupled for receiving source of operating potential $V_{EE}$. The sources of P-channel MOSFETS 104, 106, and 130, one terminal of bias resistor 114, and one terminal of current source 140 are commonly coupled together to form a node 230. CMOS low voltage operational amplifier 200 further includes a switching transistor 206 having a drain connected to a current multiplier circuit 208 and a source coupled to the drain of P-channel switching transistor 130 and for receiving a source of operating potential $V_{EE}$ through a current source 204.

Current multiplier circuit 208 comprises P-channel MOSFETS 210, 212, and 214 having gates that are commonly connected together and to the drains of P-channel MOSFETS 206 and 210 and sources coupled for receiving source of operating potential $V_{CC}$. P-channel MOSFETS 210, 212, and 214 are sized to have source area multipliers D, B, and A, respectively. Preferably, the source areas of P-channel MOSFETS 212 and 214 are sized relative to the source area of P-channel MOSFET 210. Thus, the source area of P-channel MOSFET 210 is one or unity. The drain of P-channel MOSFET 214 is connected to body terminal 116. The drain of P-channel MOSFET 212 is coupled to a current multiplier circuit 218, which comprises N-channel MOSFETS 220 and 222. The source area of N-channel MOSFET 222 is sized to have an area multiplier equal to C, relative to the source area of P-channel MOSFET 210. The gates of N-channel MOSFETS 220 and 222 are commonly connected together and to the drain of N-channel MOSFET 220, which drain is connected to the drain of P-channel MOSFET 212. The drain of N-channel MOSFET 222 is connected to the sources of P-channel transistors 104, 106, and 130 and to one terminal of bias resistor 114. The sources of MOSFETS 220 and 222 are coupled for receiving source of operating potential $V_{EE}$. The gates of P-channel MOSFETS 210, 212, and 214 are coupled for receiving source of operating potential $V_{CC}$ through a pull-up current source 224 and the gates of N-channel MOSFETS 220 and 222 are coupled for receiving source of operating potential $V_{EE}$ through a pull-down current source 226. Body terminal 116 is coupled for receiving source of operating potential $V_{EE}$ through a current source 228. Body terminal 116 is also connected to the body or body regions of P-channel MOSFETS 104 and 106.

In operation, common mode sense circuit 128 senses common mode input voltage $V_{CM}$ and compares it to a known reference voltage $V_{REF}$. By way of example, voltage $V_{REF}$ is equal to a ground potential. In response to the common mode input voltage $V_{CM}$ being greater than voltage $V_{REF}$, the voltages at the sources of P-channel MOSFETS 104 and 106 are greater than the body voltage ($V_{BODY}$) of the semiconductor material from which CMOS low voltage operational amplifier 200 is fabricated. Under this condition P-channel MOSFET 130 is on and conducting current and N-channel MOSFET 206 is off and not conducting current. A current substantially equal to $(I_1-I_2)$ flows towards node 230 to vary the potential of the body or body region of the semiconductor material or substrate from which the CMOS low voltage operational amplifier is manufactured. Preferably, current $I_1$ is set to be greater than current $I_2$. A bias current $I_T$ flows from current source 140 towards node 230 which is divided between P-channel MOSFETS 104 and 106 so that a current $I_T/2$ flows from the sources to the drains of each P-channel MOSFET 104 and 106. Current $(I_1-I_2)$ flows from node 230 through bias resistor 114, body contact 116, and current source 228 to source of operating potential $V_{EE}$. The current generated by current source 228 is labeled current $I_3$. Therefore current $I_3$ is equal to current $(I_1-I_2)$. The potential developed across bias resistor 114 by current $I_3$ generates an input pair body-to-source potential ($V_{BS}$) that is less than zero, i.e., the body-to-source potential, $V_{BS}$, for transistors 104 and 106 is less than zero. Thus, steering current $(I_1-I_2)$ through bias resistor 114 increases the body potential to be greater than the potential at the sources of transistors 104 and 106. This causes the effective threshold voltage ($V_{th}$) of input transistors 104 and 106 to be lower than their nominal value of $V_{tho}$, which increases the maximum common mode input voltage that can be achieved by CMOS low voltage operational amplifier 200.

It should be further noted that current sources 224 and 226 are included so that the gates of P-channel MOSFETS 210, 212, and 214 and the gates of N-channel MOSFETS 220 and 222 are not left floating when P-channel MOSFET 130 is on and conducting current and N-channel MOSFET 206 is off and not conducting current. More particularly, when P-channel MOSFET 130 is on and conducting current and N-channel MOSFET 206 is off and not conducting current, current source 224 provides a pull-up path to source of operating potential $V_{CC}$ and current source 226 provides a pull-down path to source of operating potential $V_{EE}$ so that the gates of P-channel MOSFETS 210, 212, and 214 are at potential $V_{CC}$ and the gates of N-channel MOSFETS 220 and 222 are at potential $V_{EE}$. It should be noted that current sources 224 and 226 are optional components that may or may not be included with CMOS low voltage operational amplifier 200.

In response to common mode sense circuit 128 sensing the common mode input voltage $V_{CM}$ being less than voltage $V_{REF}$, common mode sense circuit 128 in cooperation with current multiplier circuits 208 and 218, bias resistor 114, and current sources 202, 204, 224, 226, and 228, CMOS low voltage operational amplifier 200 changes the body voltage or potential ($V_{BODY}$) of the semiconductor material from which CMOS low voltage operational amplifier 200 is fabricated to be higher than the voltage or potential at the sources of P-channel MOSFETS 104 and 106. Under this condition, P-channel MOSFET 130 is off and therefore not conducting a substantial current. N-channel MOSFET 206 is on and conducting current $I_2$. Because N-channel MOSFET 206 is on and conducting current, it conducts substantially all of the current from current source 204. Current $I_2$ flowing through N-channel MOSFET 206 is mirrored to P-channel MOSFET 212 and multiplied by area multiplier B. Thus, the current flowing from the drain of P-channel MOSFET 212 is $B*I_2$. Here, current $I_2$ is amplified by source area multiplier B. Similarly, current $I_2$ flowing through N-channel MOSFET 206 is mirrored to P-channel MOSFET 214 and multiplied by area multiplier A. Thus a current equal to $A*I_2$ flows from the drain of P-channel MOSFET 214 and is steered or directed to body terminal 116. Here, current $I_2$ is amplified by source area multiplier A. The current flowing from the drain of P-channel MOSFET 212 is mirrored to N-channel MOSFET 222 and is multiplied by area multiplier C. Thus, a current equal to $B*C*I_2$ flows through N-channel MOSFET 222. Here, current $I_2$ is amplified by source area multipliers B and C. It should be noted that bias current $I_T$ flows from current source 224 and is divided between P-channel MOSFETS 104 and 106 do that a current $I_T/2$ flows from the sources to the drains of each P-channel MOSFET 104 and 106. Using Kirchhoff's Current Law (KCL) at node 230 produces:

$$I_1+A*I_2-I_3+I_T-I_T/2-I_T/2-B*C*I_2=0 \quad \text{EQT. 3}$$

$$I_1+A*I_2-I_3-B*C*I_2=0 \quad \text{EQT. 4}$$

$$I_1+A*I_2=B*C*I_2+I_3 \quad \text{EQT. 5}$$

Substituting EQT. 6 into EQT. 5 yields EQTS. 7-10:

$$I_3=I_1-I_2 \quad \text{EQT. 6}$$

$$I_1+A*I_2=B*C*I_2+I_1-I_2 \quad \text{EQT. 7}$$

$$A*I_2=B*C*I_2-I_2 \quad \text{EQT. 8}$$

$$A*I_2+I_2=B*C*I_2 \quad \text{EQT. 9}$$

$$B*C=A+1 \quad \text{EQT. 10}$$

where:

$I_1$ is the current flowing from current source 202;

$I_2$ is the current flowing from current source 204;

$I_3$ is the current flowing from current source 228;

A is the source area multiplier for P-channel MOSFET 214;

B is the source area multiplier for P-channel MOSFET 212; and

C is the source area multiplier for N-channel MOSFET 222.

Thus, CMOS low voltage operational amplifier 200 is designed such that current $I_3$ equals the difference between currents $I_1$ and $I_2$ (i.e., $I_3=I_1-I_2$) and the product of source area multipliers B and C equals the sum of one plus source area multiplier A (i.e., B*C=A+1). Operating under these conditions, a current equal to ($A*I_2-I_3$) flows from body contact 116 through bias resistor 114 to node 230. Here, source area multiplier amplifies current $I_2$ by source area multiplier A. The potential developed across bias resistor 114 by current ($A*I_2-I_3$) generates an input pair body-to-source potential ($V_{BS}$) that is greater than zero, i.e., the body-to-source potential, $V_{BS}$, for transistors 104 and 106 is greater than zero. Thus, steering current ($A*I_2-I_3$) through bias resistor 114 decreases the body potential to be less than the potential at the sources of transistors 104 and 106. This causes the effective threshold voltage ($V_{th}$) of the input transistors 104 and 106 to be greater than their nominal value of $V_{tho}$, which decreases the minimum common mode input voltage that can be achieved by CMOS low voltage operational amplifier 200. Accordingly, CMOS low voltage operational amplifier 200 in accordance with embodiments of the present invention has a controlled bi-directional body biasing that causes the effective threshold voltage of P-channel MOSFET transistors 104 and 106 to change in such a manner to give amplifier 200 the widest common mode input voltage range while maintaining a good common mode rejection ratio.

Similar to CMOS low voltage operational amplifier 100, CMOS low voltage operational amplifier 200 may be modified such that P-channel MOSFETS 104, 106, 130, 210, 212, and 214 are replaced by N-channel MOSFETS and N-channel MOSFETS 206, 220, and 222 are replaced by P-channel MOSFETS, the polarities of the current sources, and the configurations of the switches to form a CMOS low voltage operational amplifier in accordance with another embodiment of the present invention.

By now it should be appreciated that a circuit and a method for changing the threshold voltages of the circuit's transistors have been provided. In accordance with embodiments of the present invention, an operational amplifier and a method for increasing the input common mode voltage range of the operational amplifier have been provided. In accordance with other embodiments of the present invention, current is steered or directed to controllably and bi-directionally change the body potential of the semiconductor material or substrate from which the operational amplifier is fabricated. The common mode input voltage range is widened or increased by decreasing the effective threshold voltages of the input transistors of the operational amplifier when the common mode input voltage is greater than a reference voltage and increasing the effective threshold voltages of the input transistors of the operational amplifier when the common mode input voltage is less than the reference voltage. A current is steered or directed in one direction through a resistor when the common mode input voltage is greater than the reference voltage and another current is steered or directed in an opposite direction through the resistor when the common mode input voltage is less than the reference voltage. Steering the current through the resistor changes the potential of the body or body region of the semiconductor material or substrate from which the operational amplifier is manufactured, which changes the effective threshold voltages of the input transistors of the operational amplifier.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for changing a threshold voltage of a transistor, comprising varying a potential of a body region of a semiconductor material by steering one of a first current or a second current through a resistor in response to an input signal, wherein steering the one of the first current or the second current includes steering the first current in a first direction through the resistor in response to the input signal being greater than a reference signal and wherein steering the one of the first current or the second current includes steering the second current in a second direction through the resistor in response to the input signal being less than the reference signal.

2. The method of claim 1, wherein the input signal is a common mode input voltage.

3. The method of claim 1, wherein steering the one of the first current or the second current includes steering the first current in the first direction through the resistor in response to a common mode input signal being greater than the reference signal.

4. The method of claim 1, wherein steering the one of the first current or the second current through the resistor includes decreasing a first voltage to be less than a second voltage in response to the input signal being greater than the reference signal.

5. The method of claim 1, wherein steering the one of the first current or the second current through the resistor includes increasing a first voltage to be greater than a second voltage in response to the common mode input voltage being less than the reference signal.

6. The method of claim 1, wherein steering the one of the first current or the second current through the resistor includes opening a switch to steer the one of the first current or the second current.

7. The method of claim 1, wherein steering the one of the first current or the second current through the resistor includes closing a switch to steer the one of the first current or the second current.

8. The method of claim 1, wherein steering the one of the first current or the second current through the resistor includes steering the second current through the resistor after amplifying a third current.

9. A circuit, comprising:

a differential pair of transistors, wherein each transistor of the differential pair of transistors has a source, a drain, and a gate, and wherein the sources of each transistor of the differential pair of transistors are commonly coupled together;

a body terminal;

first and second switches coupled to the commonly coupled sources;

first and second current sources coupled to the first and second switches, respectively;

third and fourth switches coupled to the body terminal of the circuit;

third and fourth current sources coupled to the third and fourth switches, respectively;

a common mode sense circuit coupled to the commonly coupled sources of the differential pair of transistors; and a resistor coupled between the body terminal and the commonly coupled sources of the differential pair of transistors.

10. The circuit of claim 9, further including a fifth current source coupled between a first source of operating potential and the commonly coupled sources.

11. The circuit of claim 9, further including a load coupled to the drains of the differential pair of transistors, wherein the load is one of an active load or a passive load.

12. The circuit of claim 9, wherein the common mode sense circuit comprises:

a transistor having a control electrode and first and second current carrying electrodes, the control electrode coupled for receiving a reference voltage and the first current carrying electrode coupled to the first current source through the first switch; and a switch control circuit having a current sensing input, a first switch control output, and a second switch control output, the current sensing input coupled to the second current carrying electrode of the transistor, the first switch control output coupled to the first and third switches, and the second switch control output coupled to the second and fourth switches.

* * * * *